United States Patent [19]

de Matteo

[11] 4,327,832
[45] May 4, 1982

[54] CONTAINER FOR PACKAGING SEMICONDUCTOR COMPONENTS

[75] Inventor: Mario A. de Matteo, Plainfield, N.J.

[73] Assignee: Thielex Plastics Corporation, Piscataway, N.J.

[21] Appl. No.: 163,064

[22] Filed: Jun. 26, 1980

[51] Int. Cl.³ .................... B65D 85/42; B65D 65/18; H05F 3/02
[52] U.S. Cl. .................... 206/328; 206/334; 206/45.34; 206/521; 220/82 R; 361/220
[58] Field of Search ........... 206/328, 334, 331, 45.34, 206/521; 220/82 R; 361/212, 220

[56] References Cited

U.S. PATENT DOCUMENTS

| | | | |
|---|---|---|---|
| 2,919,797 | 1/1960 | McCracken | 206/45.34 |
| 3,184,056 | 5/1965 | Kisor | 206/331 |
| 3,205,764 | 9/1965 | Letter | 220/82 R |
| 3,432,380 | 3/1969 | Weber | 220/82 R |
| 4,171,049 | 10/1979 | Nohara et al. | 206/328 |

FOREIGN PATENT DOCUMENTS

WO79/01123 12/1979 PCT Int'l Appl. ................. 206/334

Primary Examiner—William T. Dixson, Jr.
Attorney, Agent, or Firm—Kenyon & Kenyon

[57] ABSTRACT

A container for packaging semiconductor components is formed by a tube adapted to longitudinally contain a stack of components and having a body portion made of electrically conductive opaque plastic and a window portion made of electrically non-conductive transparent plastic. In this way EMI shielding is provided and visual inspection of the components is possible.

4 Claims, 3 Drawing Figures

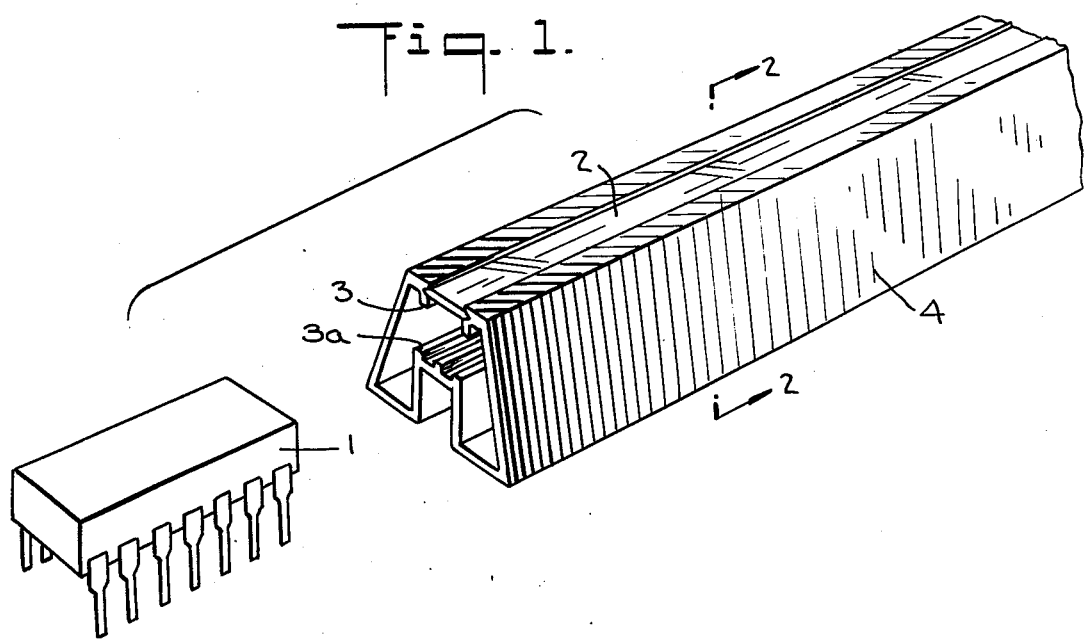
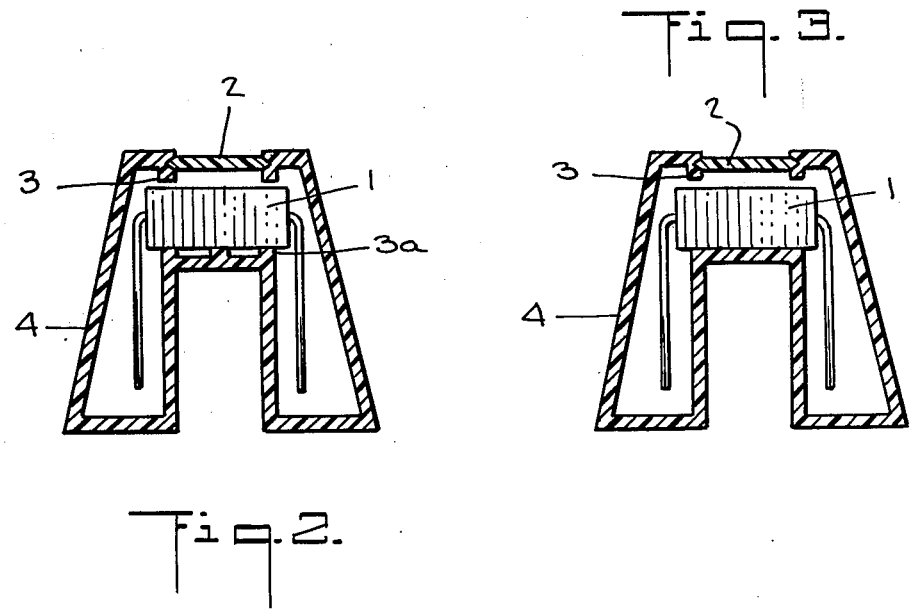

CONTAINER FOR PACKAGING SEMICONDUCTOR COMPONENTS

BACKGROUND OF THE INVENTION

Containers for packaging stacks of semiconductor components are formed by tubes in which the stacks are placed for packaging and ultimately for use as a magazine for feeding the components to automatic electronic assembly equipment.

Such a container has been made in the form of an extruded transparent plastic tube having a profile preventing the components from rotating in the tube while permitting them to slide longitudinally for feeding. Transparency permits visual inspection of the components.

Such components can be destroyed by small static electric charges. Protection against such charges can be provided by coating the transparent, and therefore electrically non-conductive, plastic with antistatic coating material.

Ambient electromagnetic interference (EMI) is currently increasing to levels also capable of charging and destroying such sensitive components. EMI shielding can be provided by making such a container from an electrically conductive plastic extruded into the tubular form, but to make a plastic adequately conductive, it must be loaded with a conductive material so that the plastic is no longer transparent.

Polyvinylchloride (PVC) is one example of a suitable extrudable plastic from which tubular forms can be produced, whether the plastic is transparent and electrically non-conductive or opaque and electrically conductive because loaded with electrically conductive material, as exemplified by carbon black or graphite or metal fibers. It is possible to coextrude PVC by the simultaneous extrusion of several melt streams to make a product that has different characteristics in various areas of its cross section, the coextruded product being integral throughout.

SUMMARY OF THE INVENTION

According to the present invention, a container for packaging a stack of electronic components requiring EMI shielding is formed by a plastic tube adapted to longitudinally contain the stack in a slidable non-rotative manner, and formed as a coextrusion having a body portion made of electrically conductive opaque plastic so as to provide the EMI shielding, and a longitudinally extending windowpane portion made of electrically non-conductive transparent plastic so as to permit inspection of the components when in the tube. The body has internal ribs which space the components from the windowpane. Being a coextrusion, all portions are integral with each other.

Further details of this invention are disclosed hereinbelow.

BRIEF DESCRIPTION OF THE DRAWINGS

FIG. 1 is a perspective view showing one end of a container embodying the invention and one of the components after feeding from the container;

FIG. 2 is a cross section taken on the line II—II in FIG. 1; and

FIG. 3 is like FIG. 2 but shows a modification.

DETAILED DESCRIPTION

These drawings show the component 1 in a familiar form having the usual depending terminal wires, FIG. 3 showing how the component appears when in the new container.

This container is a plastic coextrusion having a profile or cross section shape that is conventional for containers of this type.

The tube forming the container is coextruded so that the body portion 4, integrally including internal ribs 3 extending longitudinally in the body portion 4 on either side of the windowpane 2, is an electrically conductive and therefore opaque plastic, while the windowpane 2 is a transparent and therefore electrically non-conductive plastic. The windowpane 2 may be given an antistatic coating if desired.

The conventional profile provides a generally trapezoidal shape with the body portion 4 forming a shelf via an integral horizontally extending inverted channel opposite to the windowpane 2 and on which the component 1 rests with its terminal wires extending below the shelf as shown by FIG. 2. The invention provides for rails 3a integrally formed on this shelf and on which the components 1 can rest for easier slidability, FIG. 3 showing that these rails need not necessarily be used. Both the rails 3a, when used, or the top of the shelf if the latter is flat, and the ribs 3 are all integrally formed by the conductive plastic providing the EMI shielding, the ribs 3 preventing the components from contacting the electrically non-conductive windowpane portion 2. This prevents the generation of an electrostatic charge on the components.

The relative dimensions of the container's integral parts are such that the components, when packaged by the new container, are free to easily slide gravitationally for loading and when the container is used as a magazine. Therefore, the spacing of the inner end edges of the ribs 3 and the top of the shelf or its rails 3a if used, should permit a certain looseness or clearance for the components. If the container is oriented as shown by the drawings, the components are in electrical contact with the electrically conductive shelf of the body 4, an inversion causing the components to be supported by the ribs 3 and in electrical contact with them while the ribs effectively space the components from contacting the electrically non-conductive transparent windowpane portion 2.

The new container fully protects the components with EMI shielding, protects the components from electrostatic charging due to contacting the non-conductive windowpane 3, while all the time permitting visual inspection via the windowpane 2 of the components loaded in the container.

Such containers are made with cross sectional shapes other than exemplified by the foregoing. The principles of this invention can be applied to such other shapes.

What is claimed is:

1. A container for packaging a stack of electronic components requiring EMI shielding, said container comprising an elongated tube adapted to longitudinally contain the stack, said tube having a body portion made of electrically conductive opaque plastic so as to provide said shielding and a longitudinally extending windowpane portion made of electrically non-conductive transparent plastic so as to permit inspection of the components when in said tube, said body portion integrally forming electrically conductive plastic internal projections positioned so as to prevent said components from contacting said windowpane portion.

2. The container of claim 1 in which said projections are in the form of longitudinally extending ribs positioned adjacent to the sides of said windowpane portion and extending inwardly so as to be contacted by said components if they move towards the windowpane portion.

3. The container of claim 2 in which the tube's said body portion integrally forms an internal longitudinally extending shelf spaced from and opposite to said windowpane portion and adapted to support said components, said shelf having rails on which said components can slide longitudinally with respect to said tube.

4. The container of claims 1, 2 or 3 in which the container tube is a coextrusion of the electrically conductive and electrically non-conductive plastics.

* * * * *